US009785500B1

United States Patent
Ware et al.

(10) Patent No.: US 9,785,500 B1
(45) Date of Patent: Oct. 10, 2017

(54) REDUCED-OVERHEAD ERROR DETECTION AND CORRECTION

(71) Applicant: Rambus Inc., Sunnyvale, CA (US)

(72) Inventors: Frederick A. Ware, Los Altos Hills, CA (US); Brian S. Leibowitz, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/390,672

(22) Filed: Dec. 26, 2016

Related U.S. Application Data

(63) Continuation of application No. 14/328,941, filed on Jul. 11, 2014, now Pat. No. 9,569,308.

(60) Provisional application No. 61/846,401, filed on Jul. 15, 2013.

(51) Int. Cl.
  *G06F 11/00* (2006.01)
  *H03M 13/00* (2006.01)
  *G06F 11/10* (2006.01)
  *H03M 13/35* (2006.01)

(52) U.S. Cl.
  CPC ....... *G06F 11/1048* (2013.01); *H03M 13/356* (2013.01); *H03M 13/6502* (2013.01)

(58) Field of Classification Search
  CPC ............. G06F 11/1048; H03M 13/356; H03M 13/6502; H03M 13/255
  USPC ....... 714/746, 751, 752, 757, 758, 763, 764, 714/766, 769, 772, 773, 799, 800; 365/200, 201
  See application file for complete search history.

(56) References Cited

U.S. PATENT DOCUMENTS

| | | | | |
|---|---|---|---|---|
| 5,666,371 | A * | 9/1997 | Purdham | G06F 11/1028 714/763 |
| 6,076,182 | A * | 6/2000 | Jeddeloh | G06F 11/1028 714/763 |
| 7,124,348 | B2 | 10/2006 | Nicolaidis | |
| 7,278,085 | B1 | 10/2007 | Weng et al. | |
| 7,596,743 | B2 | 9/2009 | Goma et al. | |
| 8,099,651 | B2 | 1/2012 | Normoyle et al. | |
| 8,694,855 | B1 * | 4/2014 | Micheloni | G06F 11/1048 714/704 |
| 2003/0192005 | A1 | 10/2003 | Williamson et al. | |
| 2006/0168494 | A1 * | 7/2006 | Trainin | H03M 13/2915 714/758 |
| 2009/0158122 | A1 | 6/2009 | Gagnon | |
| 2012/0204077 | A1 | 8/2012 | D'Abreu et al. | |
| 2014/0317471 | A1 | 10/2014 | Ryu et al. | |

OTHER PUBLICATIONS

Rogers, Brian et al., "Using Address Independent Seed Encryption and Bonsai Merkie Trees to Make Secure Processors OS- and Performance-Friendly," Proceedings of the 40th Annual IEEE/ACM International Symposium on Microarchitecture (MICRO), Dec. 2007. 12 pages.

Udipi, Aniruddha et al., "LOT-ECC: LOcalized and Tiered Reliability Mechanisms for Commodity Memory Systems," 2012 39th Annual International Symposium on Computer Architecture (ISCA), pp. 285-296, Jun. 9-13, 2012. 12 pages.

* cited by examiner

*Primary Examiner* — Christine Tu
(74) *Attorney, Agent, or Firm* — Charles Shemwell

(57) ABSTRACT

A memory controller is operable in an error detection/correction mode in which N syndrome values apply to N data words of a data volume, respectively, but a single parity bit is shared across all N data words of the data volume.

20 Claims, 6 Drawing Sheets

Benchmark
EDC Mode
(EM = 0)

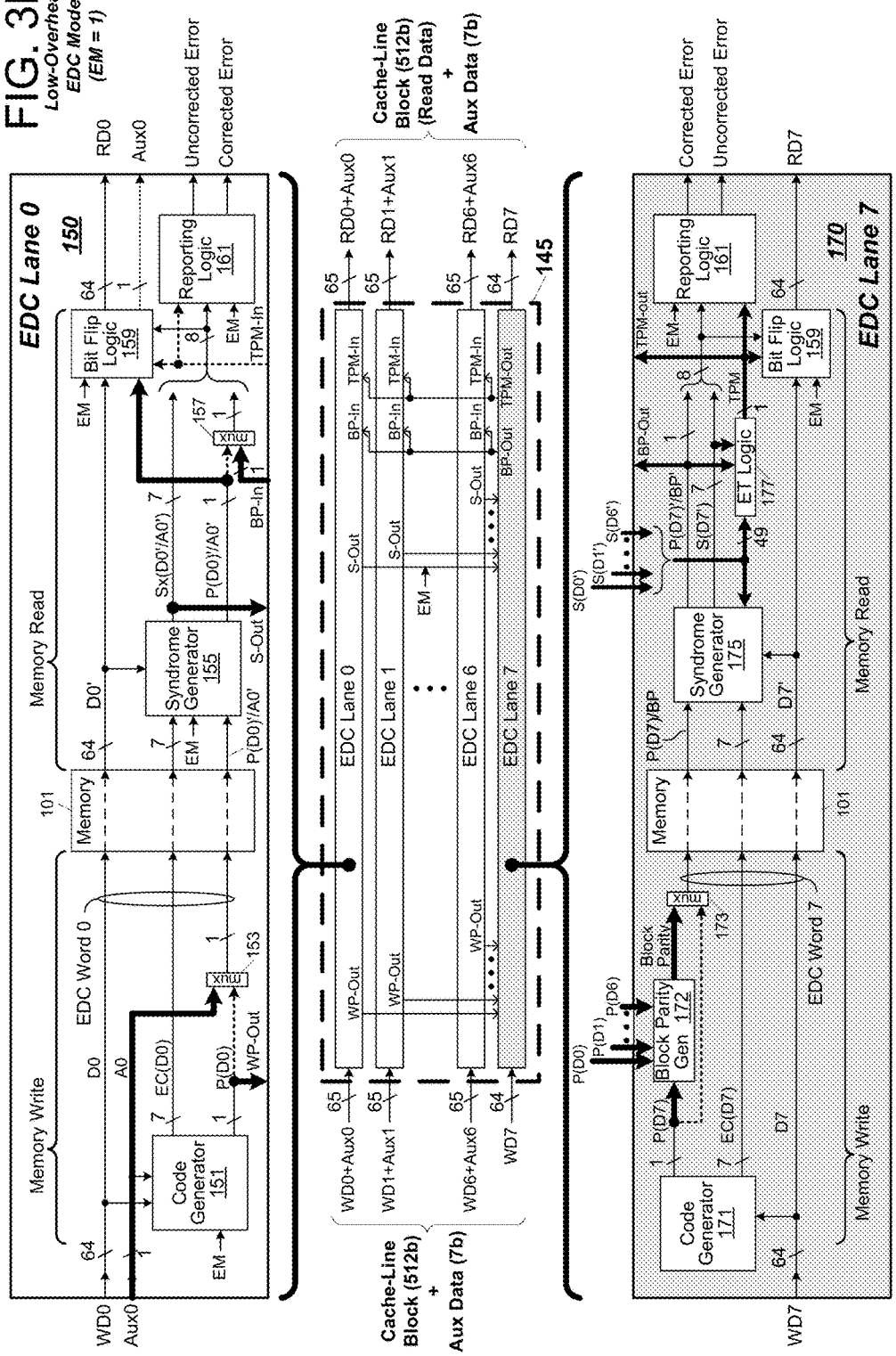

REDUCED-OVERHEAD ERROR DETECTION AND CORRECTION

CROSS-REFERENCE TO RELATED APPLICATIONS

This application is a continuation of U.S. patent application Ser. No. 14/328,941 filed Jul. 11, 2014 and entitled "Reduced-Overhead Error Detection and Correction" (now U.S. Pat. No. 9,569,308), which claims the benefit of U.S. Provisional Application No. 61/846,401, filed Jul. 15, 2013 and entitled "Reduced-Overhead Error Detection and Correction." Each of the above-identified applications is hereby incorporated by reference in its entirety.

TECHNICAL FIELD

The present invention relates generally to the field of error detection and correction in electronic systems and components thereof.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 3A and 3B illustrate an exemplary architecture and operational flow within an embodiment of an EDC circuit for the benchmark and low-overhead EDC modes, respectively, described in reference to FIGS. 1 and 2;

DETAILED DESCRIPTION

Memory systems and memory system components having reduced-overhead error detection and correction (EDC) capability are disclosed in various embodiments. In one embodiment, a memory controller is operable in at least two different EDC modes: a benchmark EDC mode in which each of N constituent data words within a data block is associated with a respective syndrome value and parity bit, and a low-overhead EDC mode in which the per-word syndrome value still applies, but a single parity bit is shared across all N data words of the data block, thus reducing the EDC overhead by N−1 bits and freeing those bits for general or specialized use. In a number of embodiments, the syndrome error-encoding scheme applied in the benchmark EDC mode is modified (extended) in the low-overhead mode to enable error detection and correction not only for the N data words, but the freed "auxiliary" bits as well. In all such embodiments, low-overhead EDC operation may be implemented without option to reconfigure for benchmark EDC mode. Embodiments in which the auxiliary bits are applied as a dynamic encryption seed to achieve substantially stronger data storage encryption than with more static seed values are also disclosed. These and other features and embodiments are discussed in further detail below.

Figure 1:
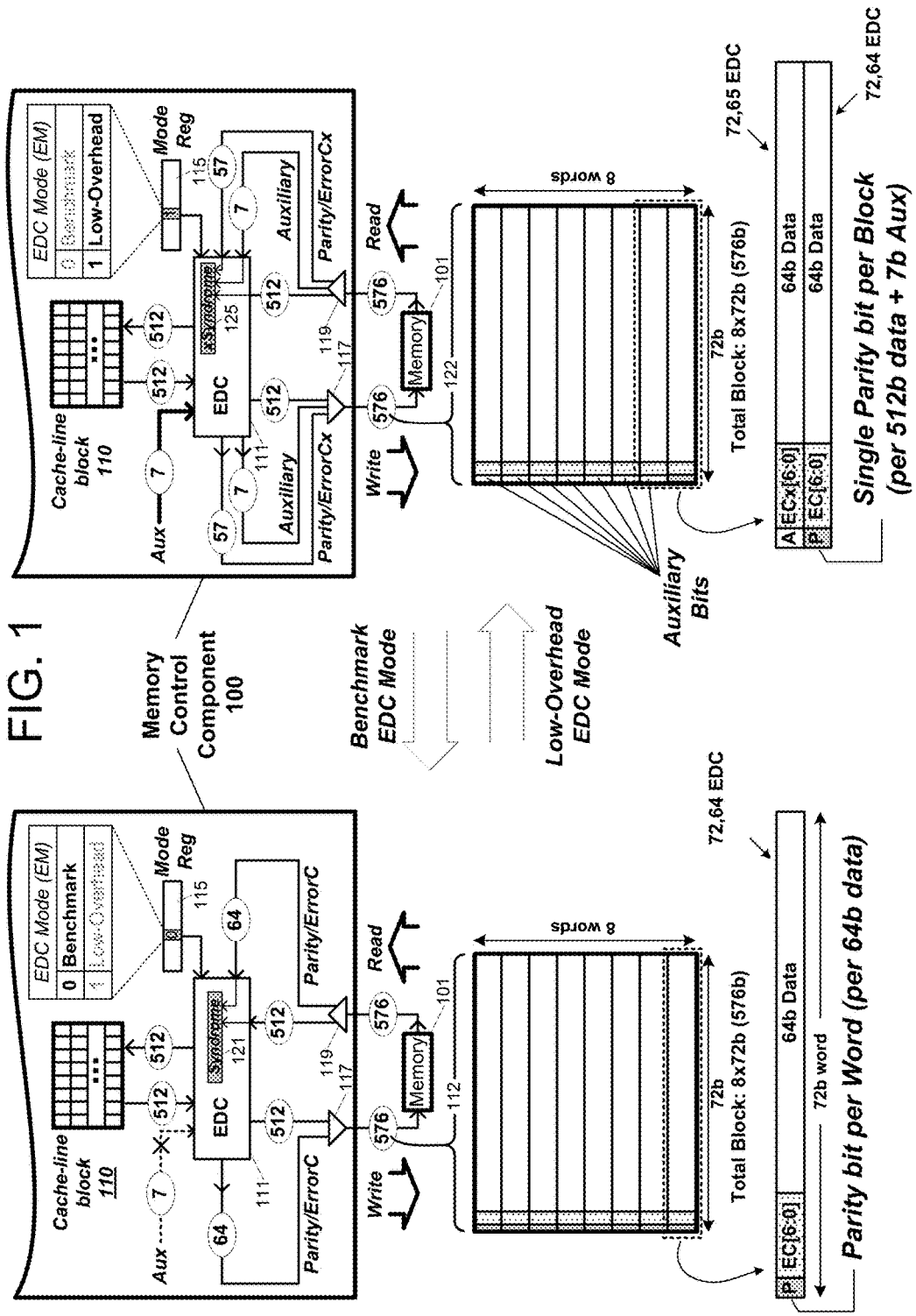
FIG. 1 illustrates an embodiment of a memory control component operable in either a benchmark EDC mode or a low-overhead EDC mode, depending on an EDC Mode setting within a mode register.

FIG. 1 illustrates an embodiment of a memory control component 100 ("memory controller") operable in either a benchmark EDC mode or a low-overhead EDC mode, depending on an EDC Mode ("EM") setting within a mode register 115. In the embodiment shown, data is buffered within a cache storage 110 (implemented within the memory control component or another component) and transferred between the cache 110 and a higher-capacity external memory 101 (e.g., one or more DRAMs) in cache-line blocks. For purposes of example, 512-bit cache-line blocks, each having eight 64-bit data words are assumed with respect to FIG. 1 and other embodiments described below. In all such cases, differently-sized cache-line blocks (or other blocks or volumes of data) and/or different numbers of data words or bits per data word may apply.

Referring first to the benchmark EDC mode shown on the left side of FIG. 1, a cache-line block to be written back to memory 101 is transferred to error detection/correction circuitry 111, which includes code generating circuitry to generate a set of eight 8-bit error-check values, each corresponding to a respective one of eight 64-bit data words (i.e., constituting the cache-line block) and composed of a 7-bit error code value ("EC[6:0]" or "ErrorC") and a parity bit. As shown, the 512 cache-line block and 64 error-check bits, 576 bits in all, are written to memory 101 in a memory write operation (which may involve one or more transfers via a data path coupled between output driver 117 of the control component and memory 101) and is stored in memory 101 thereafter until the cache-line block is recalled in a memory read operation. An exemplary format of the benchmark-mode 576-bit value, referred to herein as an "EDC block," is shown at 112, with each of eight "EDC words" including 64 data bits, a seven-bit error code value (EC[6:0]) and a word parity bit (P) as shown. In terms of error detection and correction, each EDC word is referred to as a 72,64 EDC word as it includes 72 bits total, with 64 bits of data (payload) and 8 bits of error detection/correction overhead.

During a memory read operation (initiated by one or more commands from control component 100 to memory 101), the cache-line block and associated error checking information (collectively, the "EDC block") is read-out of memory 101 and received within control component 100 via receiver 119. Note that separate write and read data paths are shown between the control and memory components for purposes of explanation only; the output driver and receiver circuitry within control component 100 may be coupled in common to a bi-directional data path and thus to counterpart data input/output (I/O) circuitry within memory 101. In any case, the EDC block read back from memory 101 is supplied to EDC circuit 111 which applies the 8-bit error-check value associated with each 64-bit data word to determine whether one or more bit errors (i.e., unintended change in logic state from '0' to '1' or '1' to '0') have occurred within the data word during transmission to or from memory 101 and/or while stored in memory 101. More specifically, within EDC circuit 111, the 7-bit error code value, parity bit and corresponding data value are supplied to a syndrome generator which generates from those values (e.g., by executing a logic function conceptually inverse to that used to generate the error code value) a 7-bit syndrome value 121 that indicates whether one or more bit errors are present in the data value.

Figure 2:
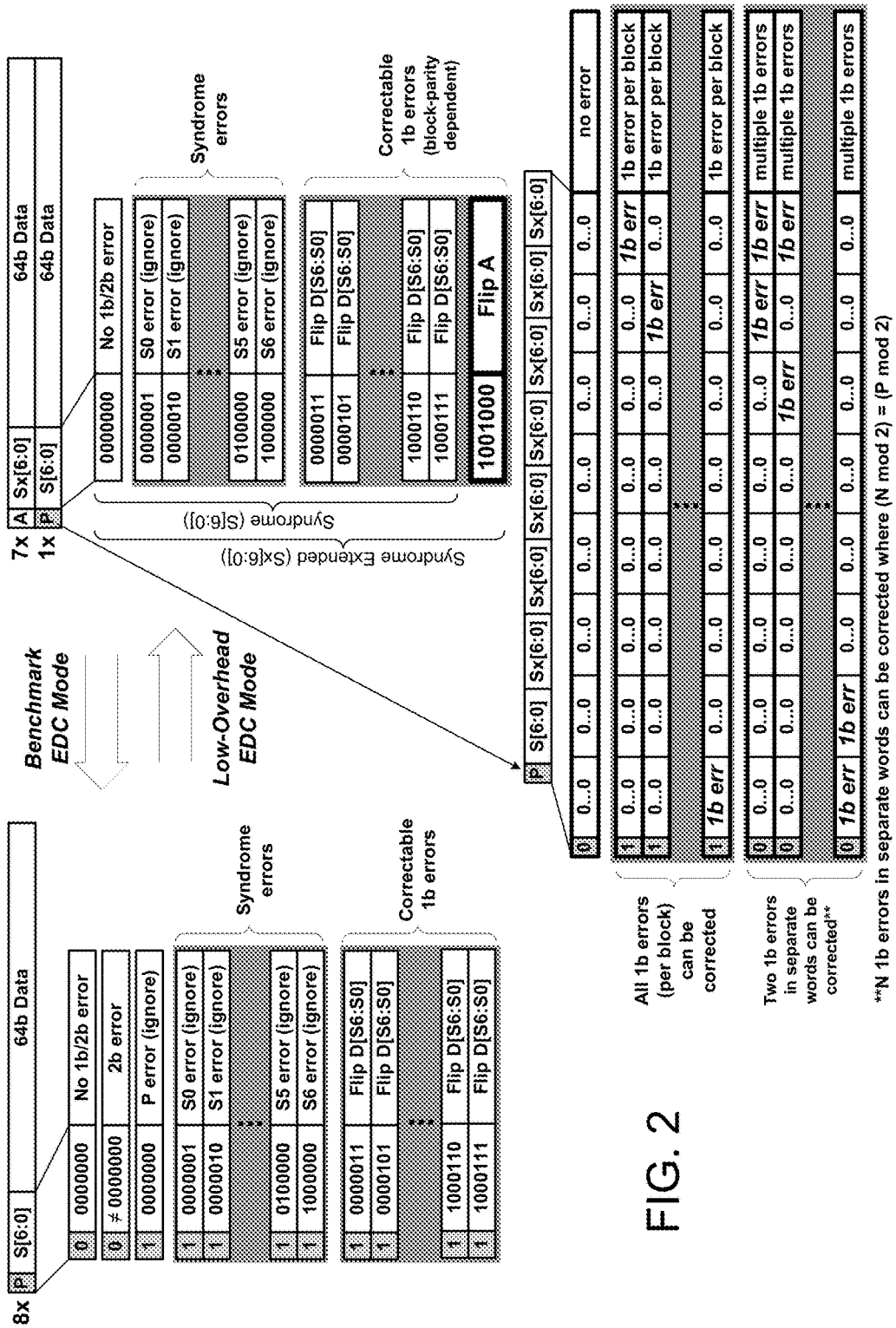
FIG. 2 illustrates exemplary interpretation of syndrome and parity information in the benchmark and low-overhead EDC modes.

FIG. 2 illustrates exemplary interpretation of syndrome and parity information in the benchmark (left) and low-overhead (right) EDC modes. As shown, in benchmark EDC mode, errors in a given data word are signaled exclusively by the syndrome and parity bit for that data word (i.e., independently of the syndrome and parity bits for any data words within the cache-line block). More specifically, a nonzero parity bit (P) in conjunction with a nonzero syndrome (S[6:0]) indicates that one or more bit errors are present either in the data value or the syndrome itself. One-hot states of the syndrome (i.e., only one nonzero syndrome bit and thus power-of-two values of the syndrome: $2^0, 2^1, 2^2, 2^3, 2^4, 2^5, 2^6$) are used to signal ignorable errors in respective bit positions within the incoming 7-bit error code value (i.e., S[6:0]='0000001' indicates an error in EC[0], S[6:0]='0000010' indicates an error in EC[1] and so forth), while incremental nonzero values, skipping the power-of-two values reserved to signal EC errors, indicate correctable single-bit errors in respective bit positions of the 64-bit data value. For example, S[6:0]='0000011' (the first non-power-of-two, nonzero syndrome value) indicates a single-bit error in data bit position 0; S[6:0]='0000101' (the second non-power-of-two, nonzero syndrome value) indicates a single-bit error in data bit position 1, and so forth to S[6:0]='1000111 (the $64^{th}$ non-power-of-two, nonzero syndrome value) which indicates a single-bit error in data bit position 63. A zero-valued syndrome in conjunction with a nonzero parity bit indicates an ignorable error in the incoming parity bit field, while a zero-valued parity bit in conjunction with a nonzero syndrome indicates that two or more bit errors are present (uncorrectable in the embodiment shown). Thus, altogether, the syndrome and parity bit indicate one of four cases:

no error (P=0, S[6:0]=0),
ignorable error (P=1, S[6:0]=0 or $2^i$, where T is an integer ranging from 0 to 6)
correctable error (P=0, S[6:0]≠2i and S[6:0]<72); and
Multiple bit errors (all other combinations of P and S[6:0])

As explained in further detail below, the syndrome and parity bit are supplied, along with their corresponding 64-bit data value, to bit-flip (or error correction) logic (e.g., within EDC circuit 111 of FIG. 1) that inverts (or toggles or flips the state of) a bit indicated to be in error. The syndrome and parity bit may also be supplied to a reporting circuit that signals uncorrectable errors when detected (e.g., to enable orderly process termination and/or other error management) and may also signal error correction events (i.e., detection of correctable errors).

Referring again to FIG. 1, when mode register 115 is programmed for low-overhead EDC mode (e.g., EM=1), EDC circuit generates error checking information that provides substantially the same error detection and correction capability as in benchmark mode, but in a significantly more compact format. In the embodiment shown at 122, for instance, instead of generating eight parity bits (one for each of the eight data words within a 512-bit cache-line block), EDC circuit 111 generates a single "block" parity bit together with a set of eight 7-bit error code values (EC), and therefore 57 bits of error checking information per EDC block instead of the 64 bits generated in benchmark mode. The more compact error checking footprint (or reduced error checking overhead) thus frees a number of bits—7 bits in the example shown—to be used for other purposes. The liberated bits are referred to generally herein as "auxiliary" bits as those bits may be used to carry various types of information as a supplement to the data words of a cache-line block (e.g., additional data, signal timing and/or voltage calibration information, encryption-seeding information and so forth). Further, in one embodiment, the 7-bit error checking codes associated with data words for which parity bits have been exchanged for auxiliary bits (e.g., seven of the eight data words in the example shown) are extended to enable single-bit error signaling with respect to the auxiliary bit position and thus enable correction of a single-bit error in 65 bit positions per data word instead of 64. As explained above, the number of bits per data word, the number of auxiliary bits liberated within the error checking information, the number of data words per data block and so forth may be different in alternative embodiments.

Still referring to the low-overhead EDC embodiment shown in FIG. 1, the 512 data bits within the cache-line block and seven auxiliary bits are referred collectively herein as "payload" bits to distinguish them from error checking information (e.g., error code values and block parity bit) which form the remainder of a 576-bit EDC block of information written to and read back from memory 101. During a block write operation, EDC circuit 111 receives the auxiliary bits from an auxiliary data source (e.g., an on-chip or off-chip data source) and supplies those bits to output driver 117 in place of unused parity bits (e.g., occupying the $72^{nd}$ bit position within seven of the 64 Parity/Error Code lines shown with respect to benchmark EDC mode). Similarly, during a block read operation, signal receiver 119 forwards the auxiliary bits received from memory 101 to the EDC circuit 111 over signal lines (and/or transmit times or slots) freed by the omitted parity bits.

In one embodiment, the auxiliary bits conveyed between memory control component 100 and memory 101 occupy vacated parity bit positions within the first seven words of an EDC block (i.e., in the $72^{nd}$ bit position as mentioned above and shown in the exemplary EDC word format at 122), while the block parity bit occupies the same bit position within the eighth word of the low-overhead EDC block as the word-parity bit in benchmark EDC mode. Consequently, the first seven words of the EDC block contain 65 payload bits, while the eighth word contains only 64 bits, thus effecting a hybrid (non-uniform) word-formatting across the EDC block. Although not required, in the embodiment shown, the error code for each of the words containing 65 payload bits is extended (and thus shown as "ECx[6:0]" instead of "EC[6:0]") to include single-bit error encoding for the auxiliary bit position. Accordingly, the following observations may apply with respect to the low-overhead EDC block format:

the parity field within one word of the EDC block is derived based on multiple words of the EDC block
the unused parity field from one word of the EDC block is covered, for purposes of bit error correction, by an error code field within or associated with that word
the unused parity field is available for purposes other than error correction/detection
non-uniform error coding and error checking schemes may be employed with respect to individual words within an EDC block
non-uniform payload sizes apply with respect to individual words within an EDC block Still referring to FIG. 1 and the low-overhead mode within memory controller 100, the syndrome generator within EDC circuit 111 applies the 519-bit payload and 56 error code bits (i.e., one error code and seven extended error codes) and block parity bit to generate a set of extended syndrome values ("xSyndrome" as shown at 125) which may be interpreted as shown in FIG. 2. More specifically, extended syndrome values having the interpretation shown in FIG. 2 (i.e., on the right-hand "low-overhead EDC mode" of FIG. 2) are generated for each of the seven expanded-payload words of the EDC block, while a non-extended syndrome is generated for the word bearing the block parity bit. As shown, in both the extended and non-extended syndrome formats, a zero valued syndrome indicates absence of an error, while a one-hot syndrome (i.e., syndrome value=$2^i$, where i is an integer ranging from 0 to 6) indicates an ignorable bit error in the syndrome itself. Depending on the state of the block parity value, as explained below, a potentially correctable single-bit error in one of 64 bit positions of the corresponding payload is signaled in the non-extended syndrome format by the 64 nonzero, non-power-of-two syndrome values between 3 and 71, inclusive, and by the 65 nonzero, non-power-of-two syndrome values between 3 and 72 in the extended syndrome format. As shown, the added ($72^{nd}$) bit error position may be used to correct a single-bit error in an auxiliary bit within an expanded-payload word of the EDC block (i.e., "Flip A" as shown in FIG. 2).

Still referring to the low-overhead EDC interpretation shown in FIG. 2, the block parity bit is evaluated in connection with the eight syndrome values (i.e., eight instances of S[6:0]) to determine whether single-bit payload errors indicated by one or more syndrome values can be corrected. More specifically, in contrast to the benchmark overhead parity/syndrome interpretation in which the per-word parity bit must be set to enable error correction, the state of the block parity bit required to enable error correction in the low-overhead EDC mode alternates, in the embodiment of FIG. 2, according to whether an odd or even number of syndromes indicate single-bit errors. In the particular embodiment shown, for example, an odd number of single-bit error indications (i.e., 1, 3, 5 or 7 syndromes indicating single-bit error in respective payloads) accompanied by an odd block parity bit (i.e., P=1) indicates that each of the single-bit errors indicated by a nonzero syndrome is correctable. Conversely, an even number of single-bit errors in respective payloads (i.e., 2, 4, 6 or 8 syndromes indicating single-bit error) are signaled to be correctable by an even (zero-valued) block parity bit. Thus, as shown in FIG. 2, up to N single-bit ("1b") errors in separate words can be corrected, where (N mod 2)=(P mod 2), where "mod" designates the modulus operator. Such a determination may be effected in a digital logic circuit, for example, by exclusive-OR combination of the block parity value and a logic '1' representation of each nonzero syndrome values (each such value itself being determined, for example, by ORing constituent bits of a given syndrome value). In alternative embodiments, the auxiliary bit position and/or block parity bit position within a given EDC word may be different from that shown in FIGS. 1 and 2.

Figure 3A:
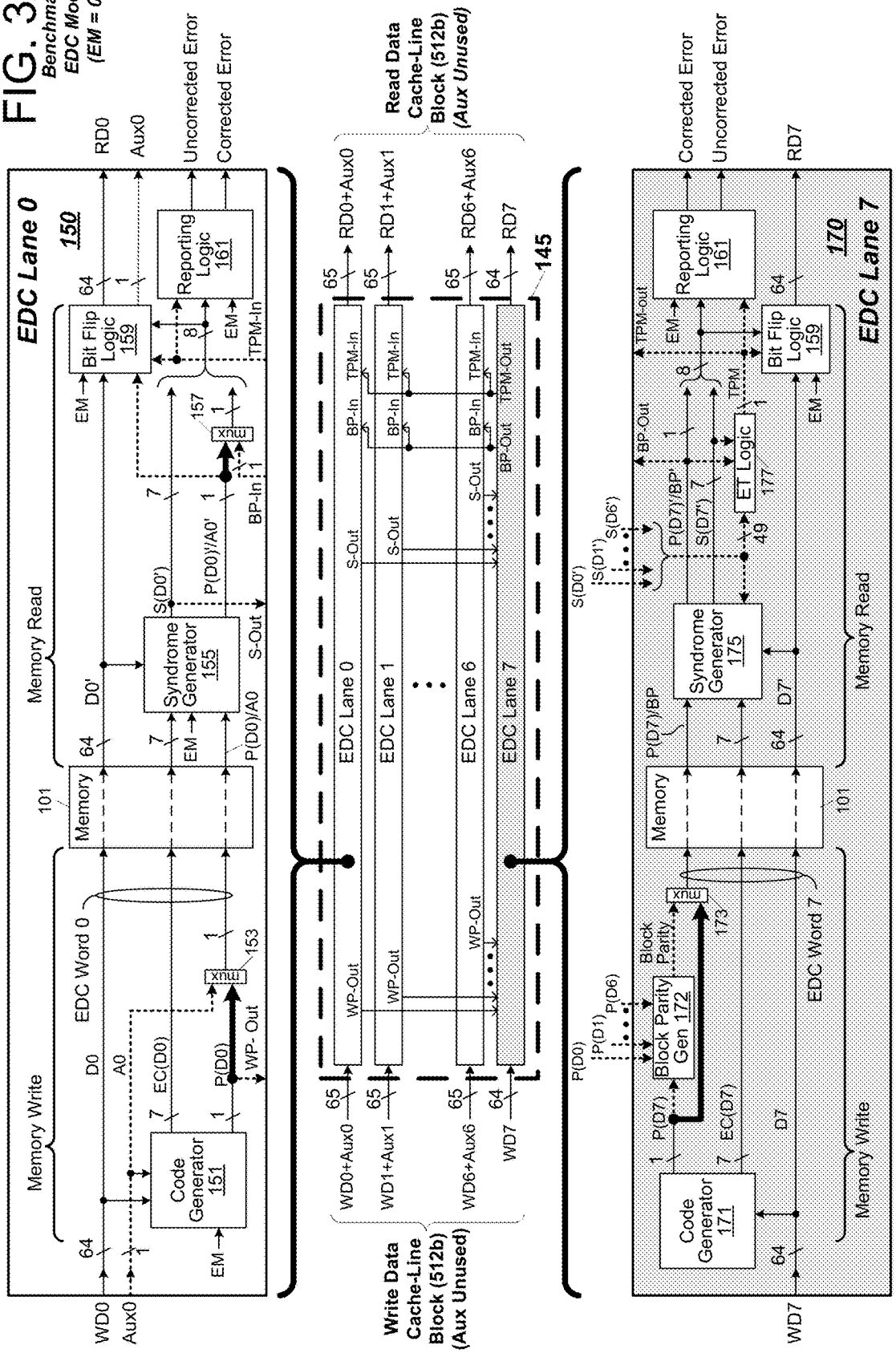

FIGS. 3A and 3B illustrate an exemplary architecture and operational flow within an embodiment of an EDC circuit 145 for the above-described benchmark and low-overhead EDC modes, respectively. In the embodiment shown, EDC circuit 145 is organized into EDC lanes 0-7 each of which generates error checking information and syndrome values for a respective payload (i.e., data word in benchmark mode, and data word+auxiliary bit in N−1 payloads of an N-payload low-overhead mode) in the round trip to and from memory. Referring first to FIG. 3A (benchmark operating mode), EDC lanes 0-6 are implemented identically as indicated by the representative embodiment of EDC lane 0 (150), each having 65-bit payload input/output ports (64-bit cache-line data word and auxiliary bit), while EDC lane 7, shown for example in embodiment 170, lacks an auxiliary bit input and thus has 64-bit payload input/output ports. Moreover, EDC lane 7 includes a block parity generator 172 coupled to receive word-parity outputs from code generator circuits 151 within each of the other EDC lanes and (and from the lane 7 code generator 171) and a mode-independent syndrome generator 175 (as the lane 7 syndrome is generated in the same non-extended format in both the benchmark and low-overhead EDC modes). By contrast, EDC lanes 0-6 each include a mode-dependent syndrome generator 155 to generate either a non-extended or extended syndrome value. EDC lane 7 also includes error-tally logic (ET) that operates in low-overhead EDC mode to tally the total number of single-bit errors within respective EDC lanes and confirm that the error tally count corresponds (e.g., as an even or odd tally) to the odd/even state of the block parity bit and, if so, assert a tally/parity match signal ("TPM") at inputs of bit flip logic 159 and reporting logic 161 within respective EDC lanes. All eight EDC lanes include a code generator to generate error code values (EC), with the code generator 151 in lanes 0-6 being mode-dependent (e.g., generating codes according to either the extended or non-extended formats described above according to whether EDC mode signal (EM) indicates low-overhead or benchmark EDC mode). All lanes also include mode-dependent bit-flip logic 159 to perform bit error correction according to either the benchmark or low-overhead error interpretation schemes shown in FIG. 2 (with those circuits accordingly receiving the EM signal). Also, all or any one of the lanes may include mode-dependent reporting logic 161 to signal detection of correctable (corrected) or uncorrectable errors. Note that, while implemented separately from EDC circuit 145 (and from the host memory control component), memory 101 is nonetheless depicted within each of the EDC lanes to help conceptualize EDC word flow in the EDC block write and read operations.

Referring to the detail view of benchmark-mode EDC lane 0 shown in FIG. 3A (which is representative of EDC lanes 1-6 as well), a 64-bit write data word (WD0) is received and supplied to code generator 151, which, in turn generates a data-dependent error code value, EC(D0), and word parity bit, P(D0). Auxiliary data input is unused in benchmark mode, as indicated by the dotted-line path leading from the Aux0 input to code generator 151 and multiplexer 153. Conversely, the word-parity output of code generator 151 (P(D0)) is used only during benchmark mode, as signified by the heavily-weighted (bold) signal line (these conventions—dotted-line for unused path, bold line for path used only in mode depicted—apply throughout FIGS. 3A and 3B). Multiplexer 153 is configured to output the word parity bit (instead of the auxiliary bit, internally shown as A0), so that the overall EDC word written to memory 101 includes a 64-bit payload (i.e., the 64-bit write data value), and eight bits of error checking information (word-parity bit plus 7-bit error code).

During a subsequent memory read in EDC lane 0 (and EDC lanes 1-6), the EDC word read from memory, including the 64-bit data value (shown as D0' to emphasize the possible error therein), 7-bit error code and word parity bit (which may also include a flipped bit), is supplied to syndrome generator 155, which in turn generates a 7-bit syndrome value and corresponding output parity bit, P(D0'). The 64-bit payload is supplied to bit flip logic 159 together with the eight-bits of error correction/detection information (7-bit non-extended-format syndrome and final word parity bit) to enable error correction operations as shown for benchmark EDC mode in FIG. 2. As shown, multiplexer 157 selects between the word parity bit output from syndrome generator 155 in benchmark mode and a block-parity input in low-overhead mode and thus yields a parity bit that, together with the syndrome value from syndrome generator 155, constitutes the eight-bit EDC value supplied to bit flip logic 159. The EDC value is also supplied to reporting logic 161 to enable generation of error status signals, including a corrected-error signal in the case of a correctable error (e.g., a single-bit error in the embodiments shown) and an uncorrected-error signal in the case of more errors than can be corrected within bit flip logic 159.

The EDC circuitry with EDC lane 7 (i.e., code generator 171, syndrome generator 175, bit flip logic 159 and reporting logic 161) performs generally the same operations described in reference to circuitry within EDC lane 0, but omits multiplexers 153 and 157 in view of the lacking auxiliary data input and block-parity input. Also, as the block parity generator 172 (and word-parity inputs from other EDC lanes) is unused in benchmark mode, multiplexer 173 is configured to select the word-parity bit for data value WD7 instead of the block-parity bit, in effect, bypassing block parity generator 172 in benchmark mode. Note that, because extended error codes and extended syndromes are not required in EDC lane 7 (i.e., the payload size is 64 bits in both benchmark and low-overhead modes), code generator 171 and syndrome generator 175 are mode-independent and thus need not receive the EDC mode signal (EM). As each EDC lane generates its own word parity value in benchmark EDC mode, error tally logic 177 within EDC lane 7 (and tally/parity match signal generated therein) is unused.

Turning to the low-overhead EDC lane operation shown in FIG. 3B, the configurations of multiplexers 153 and 157 in EDC lane 0 and multiplexer 173 in EDC lane 7 are reversed. Accordingly, multiplexer 153 passes auxiliary bit A0 to memory instead of the word parity bit (which is output via the word-parity output port, WP-Out), and thus, during memory read, passes the read-back auxiliary bit (A0') to syndrome generator 155. Syndrome generator 155 responds to the low-overhead EDC mode setting (e.g., EM='1' in the example shown) by generating an extended-format syndrome based on the 65-bit payload value (D0' and A0') and 7-bit error code obtained from memory. As shown, the syndrome value, Sx(D0'/A0'), is combined with an incoming block parity bit (received from EDC lane 7) to form 8 bits of EDC information supplied to bit flip logic 159 and reporting logic 161. Bit flip logic additionally receives the 64-bit data word and auxiliary bit (65-bit payload in all), and, if the tally/parity match signal (TPM) indicates a match between the block parity bit and total number of single-bit errors, performs bit-flipping error correction operations in accordance with the low-overhead EDC mode shown in FIG. 2 (i.e., operating with respect to the extended syndrome and block parity bit to enable correction of errors in any of the 65 payload bit positions).

Referring to EDC lane 7 operation shown in FIG. 3B (low-overhead EDC mode), block parity generator 172 generates a block-parity bit based on the word-parity bits incoming from the other seven EDC lanes (P(D0)-P(D6)) and the local word-parity bit (P(D7)) supplied by code generator 171. Multiplexer 173 is configured to pass the block parity bit to be stored in and later read-out of memory 101 instead of word parity bit P(D7), thus delivering the block parity bit to syndrome generator 175. Syndrome generator 175 also receives the error code generated by local code generator 171 and the 64-bit payload (both after being stored in and read back from memory 101) as well as the syndrome outputs from the other seven EDC lanes, Sx(D0'/A0')-Sx(D6'/A6'), and generates from these inputs a finalized block parity bit (BP', which is output to the other EDC lanes) and local syndrome, S(D7'). As shown, the local syndrome, incoming syndromes and block parity bit (57 bits in all) are supplied to error tally logic 177 which determines whether the errors within individual lanes are limited to single-bit (or otherwise correctable) errors and, if so, whether the number of single-bit errors corresponds to the odd/even state of the block parity bit. If the errors signaled by the syndrome values are limited to correctable errors and the correctable error tally comports with the block parity bit state, error tally logic asserts the tally/parity match signal (TPM) to enable error correction operations within the bit flip logic circuits 159 of respective EDC lanes. That is, TPM, is supplied together with lane 7 data value (D7') and corresponding syndrome (S(D7')) and block parity bit to bit flip logic 159 which, in turn, performs error correction operations (i.e., flips one or more bits) in accordance with the low-overhead error correction scheme shown in FIG. 2. The TPM signal, block parity bit and local syndrome are also supplied to reporting logic 161 which generates error status signals indicating whether correctable (corrected) errors or uncorrectable errors have been detected. As shown, the TPM signal is output from EDC lane 7 to the other seven EDC lanes to enable error correction operations and EDC reporting operations within counterpart bit flip logic circuits 159 and reporting logic circuits 161 of those lanes. While not specifically shown, the output of reporting logic elements 161 within each of the EDC lanes may be merged within consolidating logic to generate consolidated error reporting for the EDC block as a whole.

Figure 4:
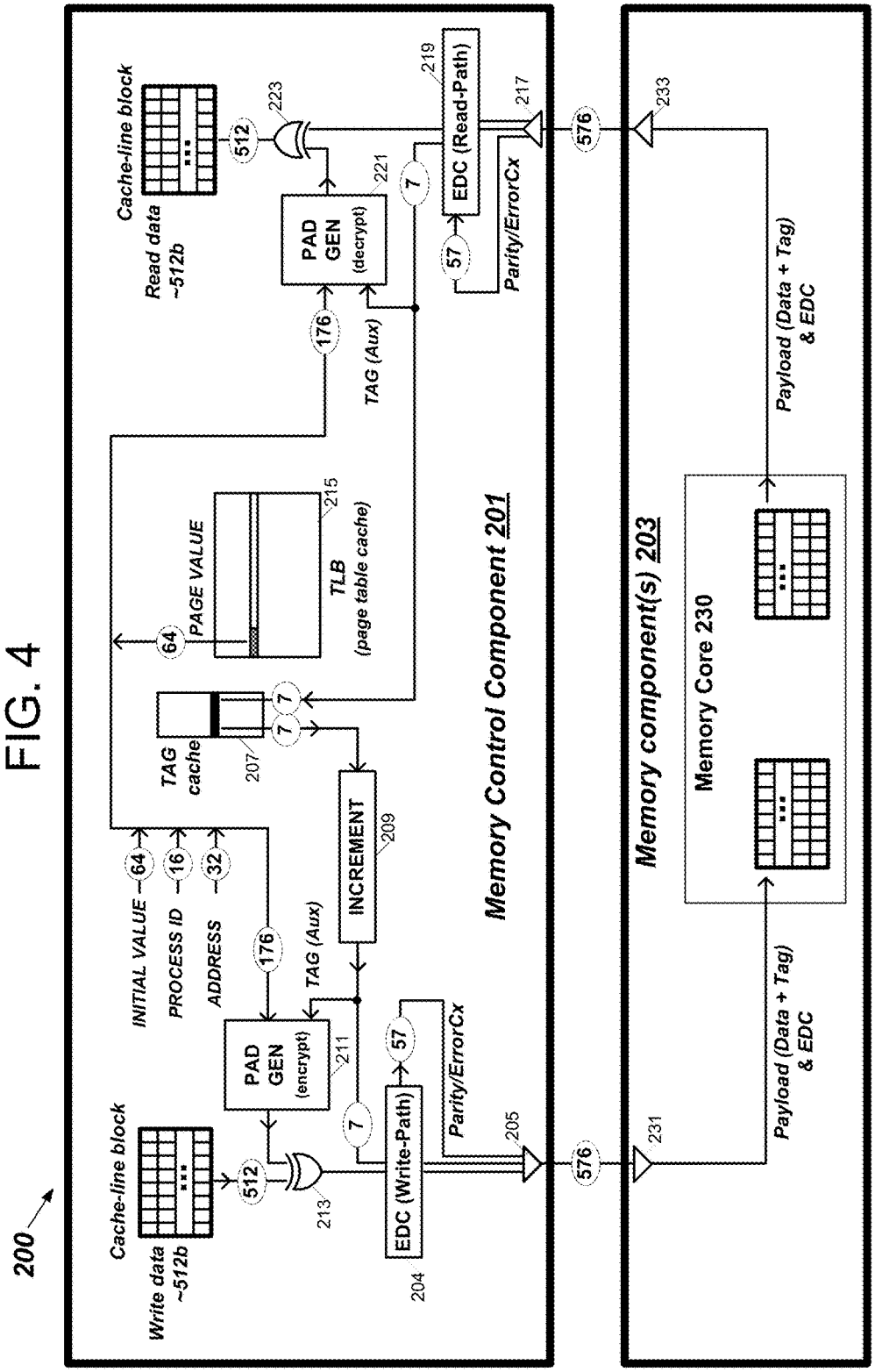
FIG. 4 illustrates an embodiment of a data-encrypting memory system that leverages the auxiliary bits made available in the low-overhead EDC mode described in reference to FIGS. 1-3.

FIG. 4 illustrates an embodiment of a data-encrypting memory system 200 that leverages the auxiliary bits made available in the low-overhead EDC mode described in reference to FIGS. 1-3. Memory system 200 may also be capable of operating in the above-described benchmark mode, or may omit that mode and the additional control signals and circuitry necessary to enable multi-modality.

As shown, memory system 200 includes a memory control component 201 ("controller") and one or more memory components 203 ("memory") interconnected by signaling links that enable transfer of payload (data and auxiliary bits) and error checking information between the controller and memory. As discussed in reference to FIG. 1, the memory control component 201 may be a dedicated memory controller, or may be a processor, application specific integrated circuit (ASIC) or other type of integrated circuit (IC) component having functionality in addition to the memory control function shown. For purposes of explanation and without limitation, memory component(s) 203 are assumed to include multiple dynamic random access memory (DRAM) chips organized in one or more individually selectable memory ranks and disposed, for example, in one or more memory modules (e.g., dual inline memory modules or DIMMs). Different types of memory technologies (e.g., Flash or other types of non-volatile memory, static random access memory (SRAM), etc.) in various other configurations or form factors (e.g., integrated with controller chip in multi-chip module, package in package, package on package, etc.) may be used in alternative embodiments. Also, while separate 576-bit transfer paths are shown between counterpart output drivers and receivers at the signaling interfaces of the memory control component and memory components (i.e., elements 205/231 and 233/217), a single bi-directional signal path, substantially narrower than that shown may be employed in alternative embodiments (e.g., with each 576-bit EDC block transfer executed in a sequence of N transfers of 576/N bits each).

Still referring to FIG. 4, write-path and read-path EDC circuits 204 and 219 are provided within controller 201 to perform EDC functions generally as shown in FIG. 3B with respect to data written to and read from memory components 203, with write-path EDC circuit 204 including code generators and a block parity generator (e.g., corresponding to elements 151/171 and 172 of FIG. 3B), and read-path EDC circuit including syndrome generators, error tally logic, bit flip logic and reporting logic (e.g., corresponding to elements 155/175, 177, 159 and 161 of FIG. 3B). In the particular implementation shown, the seven auxiliary bits supplied to write-path EDC circuit 204 constitute a dynamic seed value, referred to as an encryption "tag" (or "tag" for short), that is applied together with a static seed value to encrypt an outgoing cache-line data block. More specifically, the seven tag bits are supplied to an encryption pad generator 211 (or encryption code generator) together with a static seed component formed by a 32-bit address value (e.g., a physical or virtual cache-line address), 16-bit process value (e.g., a value used to identify the execution thread or process that triggered the cache-line write operation, or any other value unique to that process), 64-bit page value (e.g., value read from translation lookaside buffer 215 or page table cache in connection with the cache-line write operation) and a 64-bit initial value (e.g., a value generated by a processor or other component at system initialization). The encryption pad generator applies the dynamic and static seed values to generate a pad value which, in turn, is exclusively ORed with the outgoing cache-line block (e.g., within exclusive-OR circuitry 213) to deliver an encrypted cache-line block to write-path EDC circuit 204. Thus, the encryption tag (or encryption value) can be considered to be an encryption "key" or at least part of an encryption key in that it affects the pad generation which encrypts the outgoing data. In the embodiment shown, write-path EDC circuit 204 generates 57 bits of EDC information (e.g., eight 7-bit error code values and a block parity bit) which, together with the 7-bit tag value and 512-bit encrypted cache-line block, completes the 576 bit EDC block. Thus, 519 payload bits (encrypted cache-line block and tag bits) and 57 bits of EDC information are written to memory 203.

In the embodiment shown, the tag bits are written to memory 203 in the clear (i.e., without encoding or encryption) as the pad generator obfuscates the encryption operation performed using those bits. In alternative embodiments, the tag bits may be encrypted. Also, as shown, a tag cache structure 207 is provided within controller 201 to store tag values associated with respective cache-line blocks (e.g., the tag cache being indexed or addressed by the same address value used to index the data cache itself) and may be implemented as part of the data cache or as an independent storage. In the implementation of FIG. 4, each tag value retrieved from the tag cache is incremented by incrementing logic 209 prior to delivery to pad generator 211 and write-path EDC circuitry 204. By this operation, an ever-changing (dynamic) tag value is used with each cache-line write operation, resulting in substantially stronger security than achievable using the static seed value alone. Note that, as with all embodiments shown herein, the specific numbers of bits that constitute various values (e.g., seed values, cache-line word or block size, etc.) may vary in alternative implementations.

During EDC block read-back, the payload and EDC information stored in memory component(s) 203 during the write phase is retrieved from memory core 230 (i.e., DRAM array or other storage core) and conveyed to control component 201 via the chip-to-chip interconnect as discussed above. Upon receipt within controller 201, the 57 bits of EDC information, 7 tag bits and 512 encrypted data bits are supplied to read-path EDC circuit 219 which, after generating syndrome values and a block parity bit, performs the low-overhead error detection and correction function shown in FIG. 2 (optionally including the error reporting function shown in FIG. 3B). As shown, read-path EDC circuit 219 supplies the error-corrected 7-bit encryption tag to decryption pad generator 221 which, in turn, generates a decryption pad value based on the tag value and static seed information (e.g., page value, address, process ID and initial value in this example). The decryption pad is exclusive-ORed with the error-corrected 512-bit cache-line block within exclusive-OR circuitry 223 to generate an unencrypted, error-corrected cache-line block to be stored in on-chip cache memory.

Still referring to FIG. 4, the error-corrected tag value (i.e., tag value output from read-path EDC circuit 219, and thus a value in which an error may have been corrected) is also written back to tag cache 207 at the address corresponding to the cache-line block, thus overwriting the tag value obtained from the tag cache during the cache-line block write operation with the incremented tag. Note that, while a tag increment function is shown, other tag modification functions (e.g., supplying tag to linear feedback shift register or other to data-modifying logic) may be used in alternative embodiments.

Figure 5A:
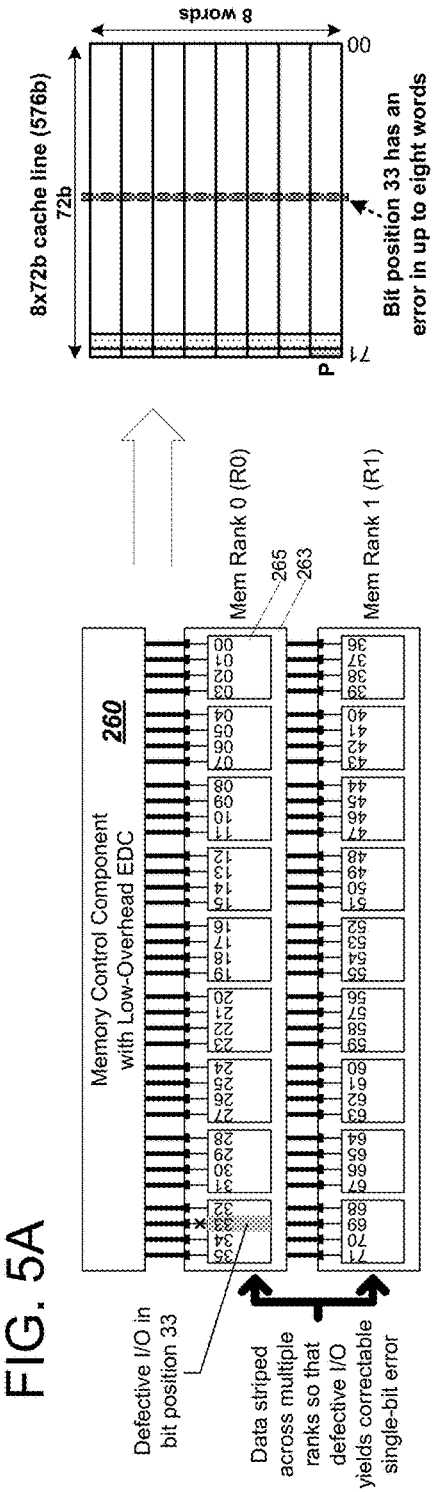
FIGS. 5A and 5B illustrate applications of memory control components with low-overhead EDC functionality within memory systems capable of overcoming bit errors that result from a defective I/O and defective memory chip, respectively
Figure 5B:
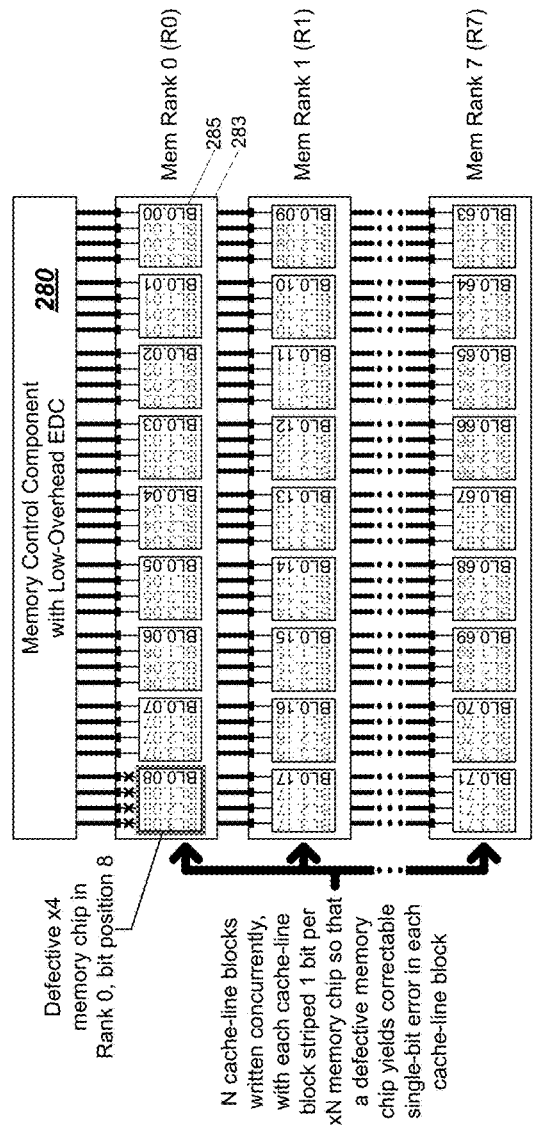

FIGS. 5A and 5B illustrate applications of memory control components with low-overhead EDC functionality within memory systems capable of overcoming bit errors that result from a defective I/O and defective memory chip, respectively. Referring first to the dead-I/O-tolerant memory system shown in FIG. 5A, a 36-bit write data path is implemented between control component 260 and a multiple-rank memory subsystem having at least two memory ranks (e.g., implemented by memory chips 265 disposed on a DIMM 263 or in respective memory modules). By striping outgoing EDC blocks across the memory components of each rank such that each I/O link is used to convey a bit from a consistent (i.e., matching) bit position within each EDC word of an EDC block, a defective I/O link or memory-component receiver or memory component logic relating to a given transceiver (collectively, a defective or dead I/O) may be compensated by the low-overhead EDC logic within control component 260. More specifically, as shown in the example, a defective I/O in bit position 33 will yield a consistent error in bit position 33 in each of up to eight words of the EDC block read back out of memory; a single-bit error that may be corrected by the low-overhead EDC logic described above. Note that, in the case of a failure in the $72^{nd}$ bit position, the non-extended syndrome for the final EDC word will not signal the error (as the $72^{nd}$ bit position is used to convey the block parity bit in the embodiment shown). However, the extended syndromes for the other seven EDC words will signal an error in the $72^{nd}$ bit position, enabling the error correction logic to infer (i.e., be designed to infer) a correctable error in the $72^{nd}$ bit position of the final EDC word as well.

In the defective chip scenario shown in FIG. 5B, memory control component 280 writes N cache-line blocks concurrently to a multi-rank memory system, with the constituent EDC words of each cache-line block being striped (i.e., distributed), one-bit per xN memory chip so that a defective memory chip yields a correctable single-bit error in each cache-line block (i.e., error in same bit position across all EDC words as shown in FIG. 5A). In the specific example shown, at least eight memory ranks 283 each constituted by nine x4 (i.e., 4 data I/O link) memory chips 285 are provided so that each bit of each 72-bit EDC word within a cache-line block is written to a separate (respective) one of 72 memory chips 285. In this case, up to four cache-line blocks may be written concurrently such that 9-bit fragments of each of four cache-line blocks are written to a selected rank of memory components in each of 64 transfers over a 36-bit data path. The I/O links within each memory component are marked in the example shown by the cache-line block number (i.e., blocks 0-3 and thus BL0-BL3) and EDC word bit number for the corresponding block, with a defective chip being shown in memory rank 0, at bit position 8 (i.e., receiving bits in position 08 in each EDC word of EDC blocks 0-3 and thus the $9^{th}$ bit of each EDC word for each of four concurrently written EDC blocks). Because each chip receives only one bit of each EDC word per cache-line block, a defective chip will yield a correctable error in one bit position (the $9^{th}$ bit position in this example) in each EDC word of each cache-line block—a single-bit error that may be corrected by low-overhead EDC logic within memory control component 280 as described above.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within a memory control component, the method comprising:
    reading from one or more memory components, as part of a data block, a plurality of first-format words each consisting of M+N bits organized within an N-bit payload field and an M-bit error detection/correction field;
    reading from the one or more memory components, as part of the data block, a second-format word consisting of M+N bits organized in an (N−1)-bit payload field, an M-bit error detection/correction field, and a one-bit parity field; and
    determining, for each of the first-format words, whether an error exists at any of N bit positions within the N-bit payload field based at least a part on the M-bit error detection/correction field.

2. The method of claim 1 wherein the N-bit payload field within each of the first-format words comprises a plurality of non-contiguous subfields.

3. The method of claim of claim 1 wherein the N-bit payload field within each of the plurality of first-format words comprises an (N−1)-bit data field and a one-bit encryption field, the method further comprising decrypting contents of the (N−1)-bit data fields of the plurality of first-format words using an encryption value that includes bits from respective encryption fields of the plurality of first-format words.

4. The method of claim 1 further comprising determining whether an error within the N-bit payload field of one of the first-format words is correctable based at least in part on the parity field within the second-format word.

5. The method of claim 4 wherein determining whether the error within the N-bit payload field of one of the first-format words is correctable comprises determining whether the error is correctable based at least in part on (i) the parity field within the second-format word, (ii) the error detection/correction fields within the others of the first-format words and (iii) the error detection/correction field within the second-format word.

6. The method of claim 1 further comprising identifying, for at least one of the first-format words for which an error is determined to exist within the N-bit payload field, a bit position within the N-bit payload field at which the bit value is in error.

7. The method of claim 6 wherein identifying the bit position within the N-bit payload field of the at least one of the first-format words at which the bit value is in error comprises identifying the bit position based at least in part on the M-bit error detection/correction field within the at least one of the first-format words and the one-bit parity field within the second-format word.

8. The method of claim 1 further comprising identifying, for at least two of the first-format words for which respective errors are determined to exist within respective N-bit payload fields thereof, a respective bit position within the N-bit payload field of each of the at least two of the first-format words at which the bit value is in error.

9. The method of claim 1 wherein determining, for each of the first-format words, whether an error exists at any of N bit positions within the N-bit payload field comprises detecting occurrence of two single-bit errors exist at respective positions of the N-bit payload field of one of the first-format words based on the M-bit error detection/correction field of the one of the first-format words and on the one-bit parity field of the second-format word.

10. The method of claim 1 wherein the N-bit payload field within each of the plurality of first-format words spans an odd number of bits such that reading the plurality of first-format words comprises reading, for each of the plurality of first-format words, an odd number of payload bits.

11. A memory control component comprising:
  receiver circuitry to receive a block of data from one or more memory components, the block of data including (i) a plurality of first-format words each consisting of M+N bits organized within an N-bit payload field and an M-bit error detection/correction field and (ii) a second-format word consisting of M+N bits organized in an (N−1)-bit payload field, an M-bit error detection/correction field, and a one-bit parity field; and
  error detection circuitry to determine, for each of the first-format words, whether an error exists at any of N bit positions within the N-bit payload field based at least a part on the M-bit error detection/correction field.

12. The memory control component of claim 11 wherein the N-bit payload field within each of the first-format words comprises a plurality of non-contiguous subfields.

13. The memory control component of claim 11 wherein the N-bit payload field, within each of the plurality of first-format words, comprises an (N−1)-bit data field and a one-bit encryption field, the memory control component further comprising decryption circuitry to decrypt contents of the (N−1)-bit data fields of the plurality of first-format words using an encryption value that includes bits from respective encryption fields of the plurality of first-format words.

14. The memory control component of claim 11 further comprising error correction circuitry to determine whether an error within the N-bit payload field of one of the first-format words is correctable based at least in part on the parity field within the second-format word.

15. The memory control component of claim 14 wherein the error correction circuitry to determine whether the error within the N-bit payload field of one of the first-format words is correctable comprises circuitry to determine whether the error is correctable based at least in part on (i) the parity field within the second-format word, (ii) the M-bit error detection/correction fields within the others of the first-format words and (iii) the M-bit error detection/correction field within the second-format word.

16. The memory control component of claim 11 wherein the error detection circuitry comprises logic circuitry to identify, for at least one of the first-format words for which an error is determined to exist within the N-bit payload field, a bit position within the N-bit payload field at which the bit value is in error.

17. The memory control component of claim 16 wherein the logic circuitry to identify the bit position within the N-bit payload field of the at least one of the first-format words at which the bit value is in error comprises circuitry that identifies the bit position based at least in part on the M-bit error detection/correction field within the at least one of the first-format words and the one-bit parity field within the second-format word.

18. The memory control component of claim 11 wherein the error detection circuitry comprises logic circuitry to identify, for at least two of the first-format words for which respective errors are determined to exist within respective N-bit payload fields thereof, a respective bit position within the N-bit payload field of each of the at least two of the first-format words at which the bit value is in error.

19. The memory control component of claim 11 wherein the error circuitry to determine, for each of the first-format words, whether an error exists at any of N bit positions within the N-bit payload field comprises circuitry to detect occurrence of two single-bit errors exist at respective positions of the N-bit payload field of one of the first-format words based on the M-bit error detection/correction field of the one of the first-format words and on the one-bit parity field of the second-format word.

20. A memory control component comprising:
  means for reading from one or more memory components, as constituents of a data block, (i) a plurality of first-format words each consisting of M+N bits organized within an N-bit payload field and an M-bit error detection/correction field, and (ii) a second-format word consisting of M+N bits organized in an (N−1)-bit payload field, an M-bit error detection/correction field, and a one-bit parity field; and
  means for determining, for each of the first-format words, whether an error exists at any of N bit positions within the N-bit payload field based at least a part on the M-bit error detection/correction field.

* * * * *